US005747845A

United States Patent [19]

Iwasa

[11] Patent Number: 5,747,845
[45] Date of Patent: May 5, 1998

[54] SEMICONDUCTOR MEMORY DEVICE WITH MEMORY CELLS EACH HAVING TRANSISTOR AND CAPACITOR AND METHOD OF MAKING THE SAME

[75] Inventor: Shoichi Iwasa, Tokyo, Japan

[73] Assignee: Nippon Steel Corporation, Tokyo, Japan

[21] Appl. No.: 700,082

[22] Filed: Aug. 20, 1996

[30] Foreign Application Priority Data

Aug. 22, 1995 [JP] Japan .................... 7-236122

[51] Int. Cl.⁶ .................... H01L 27/08; H01L 29/76; H01L 29/94; H01L 31/119
[52] U.S. Cl. .................... 257/306; 252/304
[58] Field of Search .................... 257/296, 300, 257/304, 306, 508

[56] References Cited

U.S. PATENT DOCUMENTS

| 4,994,893 | 2/1991 | Ozaki et al. | 257/306 |
| 5,235,199 | 8/1993 | Hamamoto et al. | 257/306 |

FOREIGN PATENT DOCUMENTS

| A-1-179449 | 7/1989 | Japan . |
| A-3-145159 | 6/1991 | Japan . |
| A-6-5811 | 1/1994 | Japan . |

Primary Examiner—Wael Fahmy
Assistant Examiner—Howard Weiss
Attorney, Agent, or Firm—Pollock, Vande Sande & Priddy

[57] ABSTRACT

A semiconductor memory device comprises a plurality of memory cells on a semiconductor substrate, each including a transistor with a pair of impurity diffusion layers and a gate electrode, and a capacitor, a first insulating film covering the transistors, a plurality of parallel extending word lines formed on the substrate, each being connected to the gate electrode of the transistor of at least one selected memory cell, a plurality of bit lines, each connected to one of the pair of impurity diffusion layers of at least one selected memory cell through a first contact hole in the first insulating layer, each bit line formed with a conductive film on a top surface thereof and a second insulating film interposed therebetween, a lower electrode of the capacitor at a predetermined position on the first insulating film electrically connected to one of the bit lines and to the other of the pair of impurity diffusion layers through a second contact hole formed in the first insulating film, wherein the conductive film on the top surface of each of the bit lines is formed by a material having an etching rate lower than that of the first insulating film in etching the first insulating film for the second contact hole.

36 Claims, 8 Drawing Sheets

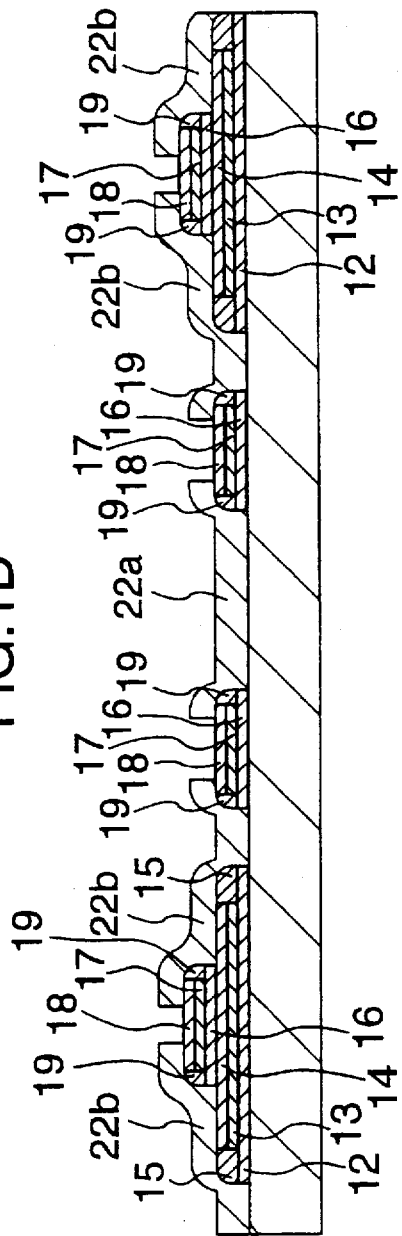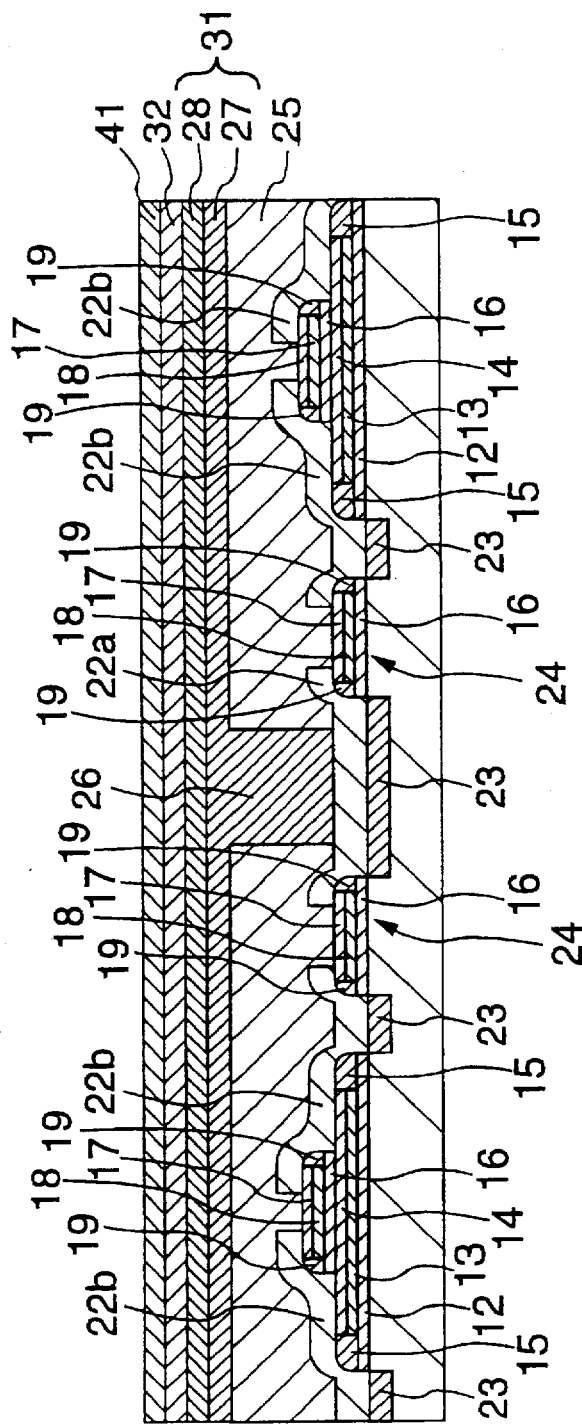

SEMICONDUCTOR MEMORY DEVICE WITH MEMORY CELLS EACH HAVING TRANSISTOR AND CAPACITOR AND METHOD OF MAKING THE SAME

BACKGROUND OF THE INVENTION

1. Field of the Invention

The present invention relates to a semiconductor memory device with memory cells each having a transistor and a capacitor, and to a method of making the same. More particularly it relates to a semiconductor memory device such as a DRAM with memory cells each having a transistor and a capacitor which is formed above a bit line.

2. Description of the Related Art

JP-A-3-145159 discloses a DRAM in which, in order to increase a capacitance of a capacitor of each memory cell of the DRAM, a portion of a transistor is used as a lower electrode of the capacitor.

A COB (Capacitor-Over-Bit line) in which a capacitor is arranged above a bit line, has been known as one type of DRAM memory cell structures. In the COB type memory cell structure, the capacitor may be extended over the bit line so that a memory cell capacitance can be increased without increasing the memory cell area and the bit lines may be shielded by the cell plate (upper electrode) of the capacitor so that a noise between bit lines is reduced.

On the other hand, as the DRAM memory cell is miniaturized, a pitch of the bit lines is also narrowed. Thus it has become difficult to secure alignment margin between a contact hole for a lower electrode (storage electrode) of the capacitor and the bit line so that an SAC (Self-Aligned Contact) technology to open the contact hole self-aligned with the bit line has been used.

A DRAM of the COB type memory cell structure in which the contact holes for the lower electrode of the capacitor are formed as self-aligned to the bit line and the element isolation region is formed of a field shield structure is disclosed in JP-A-6-5811 and JP-A-1-179449.

Each memory cell of the COB type DRAM includes a MOS transistor and a capacitor in which the MOS transistor comprises a gate electrode formed on a surface of a P-type silicon substrate, for example, and a pair of impurity diffusion layers formed at the opposite sides of the gate electrode in the surface of the silicon substrate. The capacitor comprises a lower electrode of a polysilicon film electrically connected to one of the pair of impurity diffusion layers, and an upper electrode of a polysilicon film formed on the lower electrode with an insulating film interposed therebetween. An interlayer insulating film of a BPSG film is formed to cover the MOS transistors. The DRAM has a plurality of bit lines formed on the interlayer insulating film and each of the bit lines is electrically connected to the other layer of the pair of impurity diffusion layers of each of the transistors of a plurality of selected MOS transistors through the contact hole formed in the interlayer insulating film. Each bit line is connected to a sense amplifier and an I/O gate of a peripheral circuit. Each bit line is formed by a two-layer polycide film of a polysilicon film and a tungsten silicide film such that a top surface of the polycide film is covered with a silicon oxide film, and both sides of the polycide film and the silicon oxide film are covered by sidewall oxide films of silicon oxide films. In the COB type DRAM, the lower electrode of the capacitor of each memory cell is formed above one of the bit lines and electrically connected to the other of the impurity diffusion layers of the MOS transistor of the memory cell through the contact hole formed in the interlayer insulating film of the BPSG film as self-aligned with the silicon oxide film of the one bit line and the sidewall oxide film used as a mask.

In order to connect the lower electrode to the one of the impurity diffusion layers, the contact hole formed in the interlayer insulating film of the BPSG film is formed by etching in self-aligned with the silicon oxide film of the bit line and the sidewall oxide films used as the mask. But since it is difficult to secure a sufficiently large etching selection ratio between the BPSG film and the silicon oxide film and the sidewall oxide films, the silicon oxide film and the sidewall oxide films are etched by a relatively large amount when the contact hole is formed. Accordingly, the thicknesses of the silicon oxide film and the sidewall oxide films covering the bit line should be sufficiently large to prevent a shortcircuit between the polycide layer of the bit line and the polysilicon film of the lower electrode.

However, as the thickness of the silicon oxide film is increased, the lower electrode of the capacitor is necessarily formed at a higher level, and a step between the memory cell array area of the DRAM and the peripheral circuit area becomes higher. As a result, in the photolithographing to form wiring crossing the memory cell array area and the peripheral circuit area such as strap wiring of the word lines, resolution error due to insufficient depth of focus in light exposure occurs. Thus, in the prior art COB type DRAM, it has been difficult to manufacture it with a high yield.

SUMMARY OF THE INVENTION

It is an object of the present invention to provide a COB type semiconductor memory device capable of reducing the height of the lower electrode of the capacitor by making smaller a step between the memory array area and the peripheral circuit area, enabling manufacturing of the semiconductor memory device with a high yield and increasing the memory cell capacitance without expanding the memory cell area. It is also an object to provide a method of manufacturing the same.

The semiconductor memory device of the present invention comprises: (a) a plurality of memory cells each including a transistor having a pair of impurity diffusion regions and a gate electrode and a capacitor; (b) an interlayer insulating film formed to cover the memory cells; (c) a plurality of word lines formed on the surface of the semiconductor substrate and extending parallel to each other, each word line being connected to the gate electrode of the transistor of at least one selected memory cell; (d) a plurality of bit lines each connected to one of the pair of impurity diffusion regions of at least a selected one of the memory cells through a first contact hole formed in the interlayer insulating film; (e) a conductive film formed on a top surface of each of the bit lines with an insulating film interposed therebetween; and (f) a lower electrode of the capacitor of each memory cell formed at a predetermined position on the interlayer insulating film, the lower electrode being electrically connected to the conductive film formed on one of the bit lines and also electrically connected to the other of the pair of impurity diffusion regions of the transistor of the associated memory cell through a second contact hole formed in the interlayer insulating film. The conductive film formed on the top surface of each of the bit lines is formed by a material having an etching rate lower than that of the interlayer insulating film in etching for making the second contact hole in the interlayer insulating film.

A method of making a semiconductor memory device with a plurality of memory cells each having a transistor and a capacitor according to the present invention comprises the steps of: (a) forming a plurality of parallelly extending word lines on a surface of a semiconductor substrate, each word line constituting gate electrodes of the transistors of selected ones of the memory cells; (b) forming a pair of impurity diffusion layers at opposite sides of each of the word lines in the surface of the semiconductor substrate, the pair of impurity diffusion layers forming a source and a drain of the transistor of each of the selected memory cells; (c) forming an interlayer insulating film wholely on the surface of the semiconductor substrate to cover the word lines; (d) forming a plurality of bit lines extending parallelly in a direction traversing the word lines on the interlayer insulating film, each of the bit lines being electrically connected to one of the pair of impurity diffusion layers formed at the opposite sides of one of the word lines through a first contact hole formed at a predetermined position of the interlayer insulating film; (e) forming a first conductive film on a top surface of each of the bit lines with an insulating film interposed therebetween; (f) forming a second contact hole at a predetermined position of the interlayer insulating film by etching as self-aligned with one of the bit lines having the first conductive film formed thereon used as a mask; and (g) forming a second conductive film serving as a lower electrode of the capacitor of one of the memory cells at the predetermined position on the interlayer insulating film. The second conductive film serving as the lower electrode is electrically connected to the first conductive film on the top surface of the corresponding bit line and the other of the pair of impurity diffusion layers through the second contact hole. The conductive film formed on the top surface of each of the bit lines is made of a material having an etching rate lower than that of the interlayer insulating film when etching the interlayer insulating film for forming the second contact hole.

BRIEF DESCRIPTION OF THE DRAWINGS

FIGS. 1A-1G show sectional structures taken along a line I-I' of FIG. 3 in the respective steps of the manufacturing method of the semiconductor memory device in accordance with a first embodiment of the present invention.

DESCRIPTION OF THE PREFERRED EMBODIMENTS

The present invention is explained with reference to the accompanying drawings for an application to a DRAM which uses an element isolation structure by a field shield electrode.

Figure 2A:
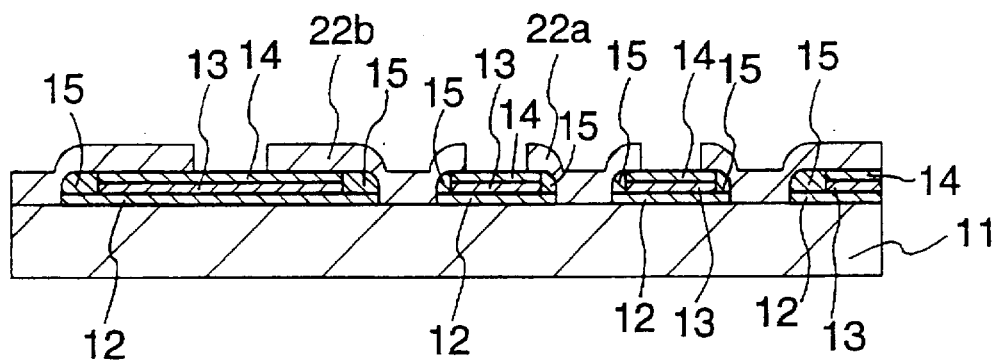
FIGS. 2A-2F show sectional structures taken along a line II-II' of FIG. 3 in the respective steps of the manufacturing method of the semiconductor memory device in accordance with the first embodiment of the present invention.
Figure 2B:
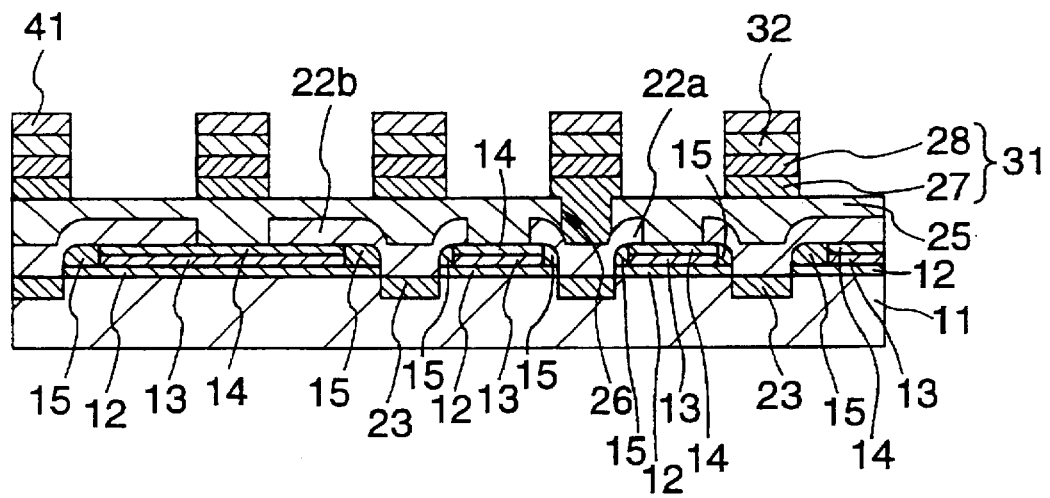
Figure 2C:
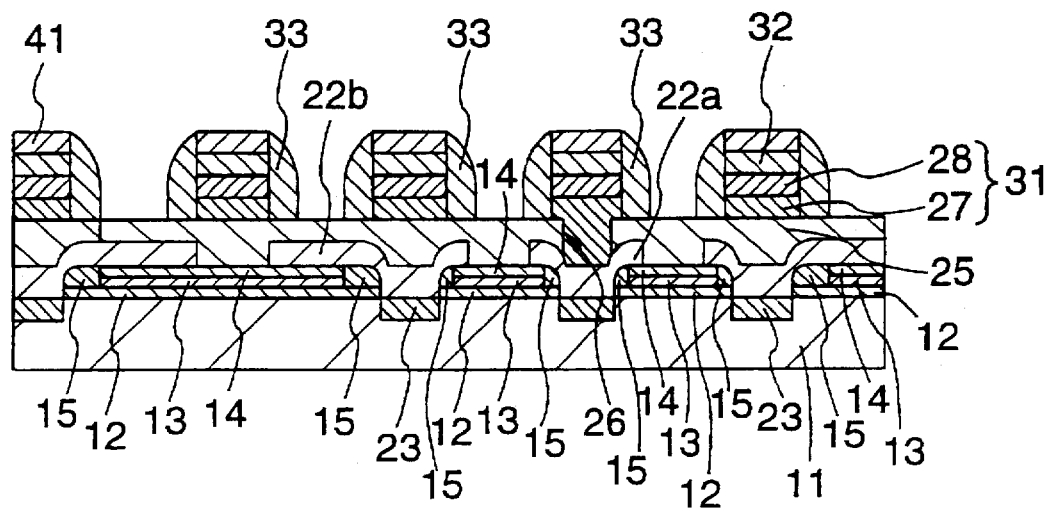
Figure 2D:
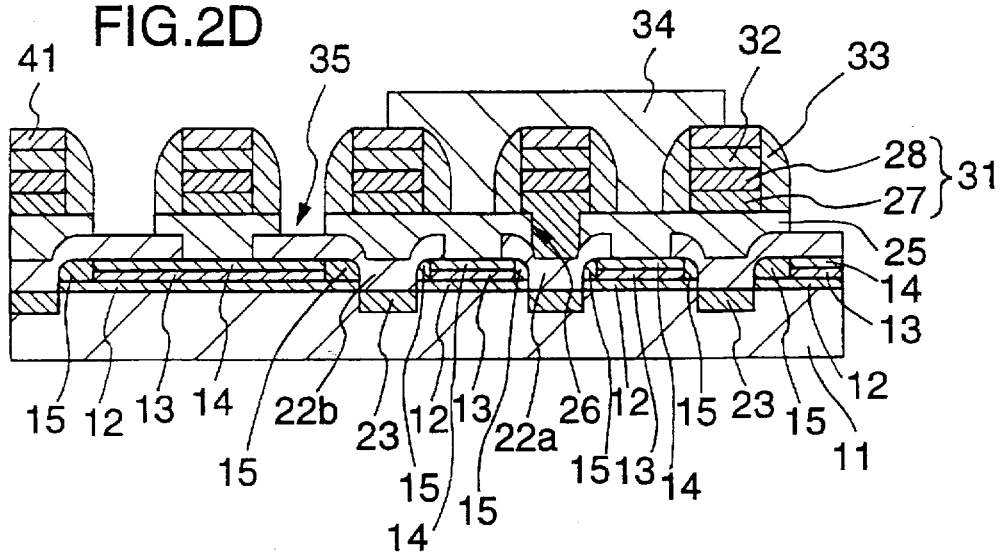
Figure 2E:
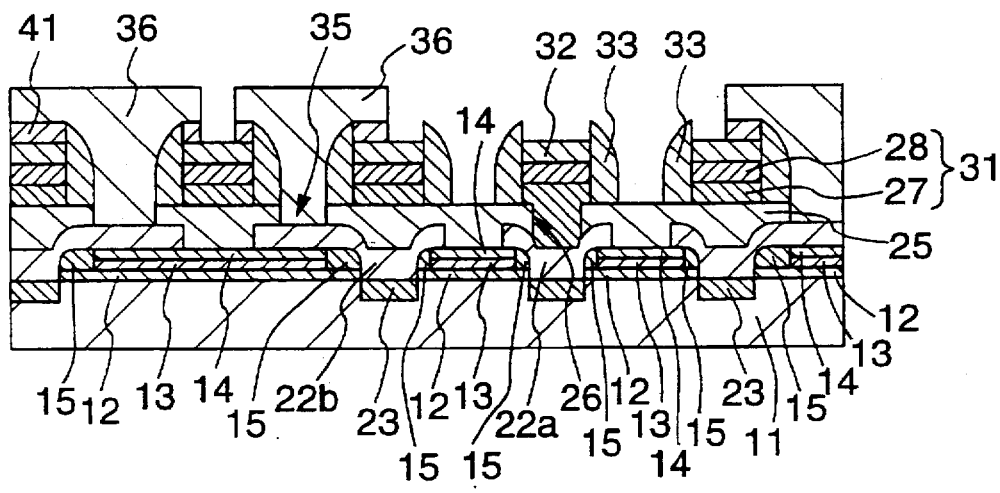
Figure 2F:
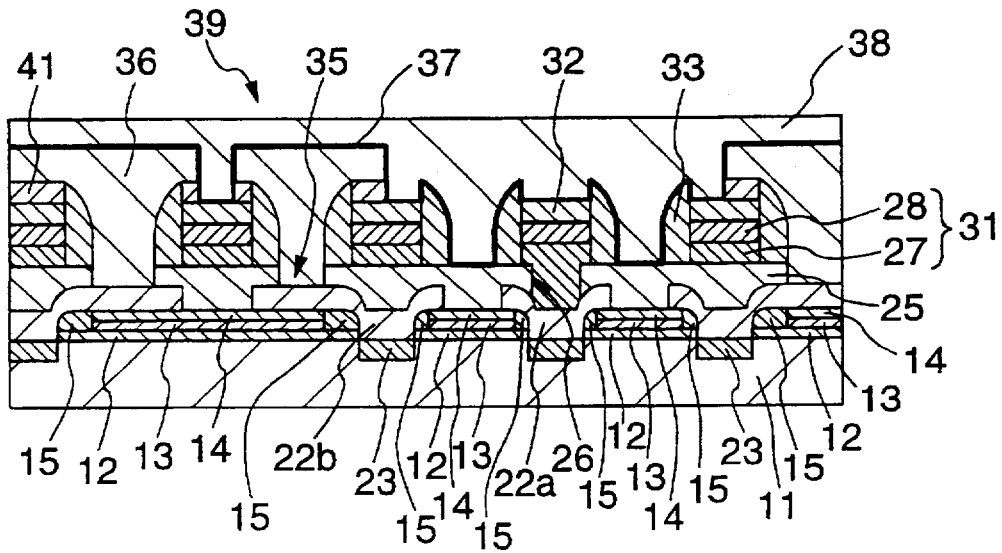
Figure 3:
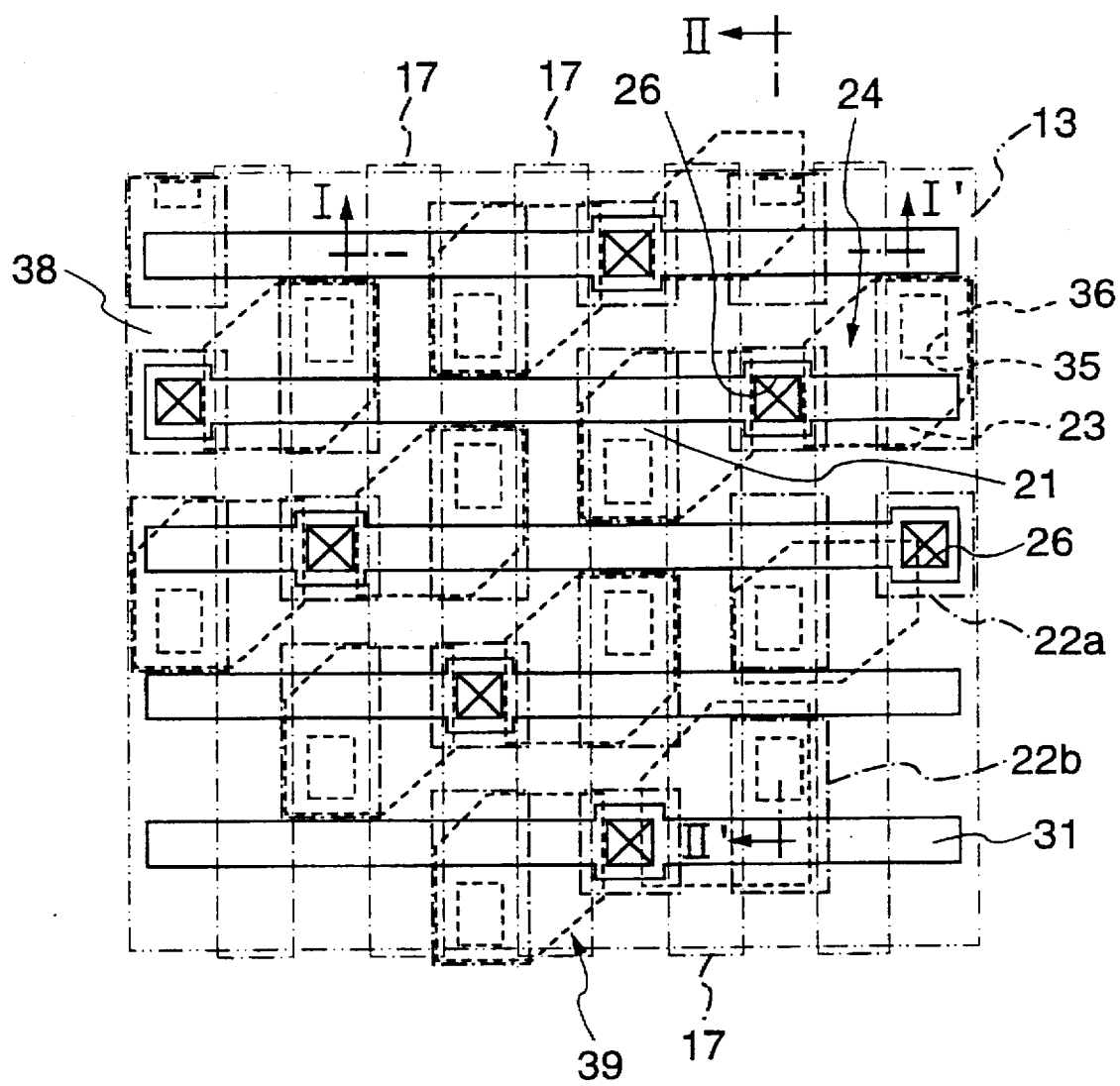
FIG. 3 is a plan view showing an arrangement of memory cells of the semiconductor memory device of the first embodiment of the present invention.

Referring to FIGS. 3 and 2F, each of the memory cells of a DRAM comprises a transistor 24 and a capacitor 39. The MOS transistor 24 has a gate electrode (word line) formed by a polysilicon film 17 and source/drains formed by a pair of impurity diffusion layers 23 on the opposite sides of the gate electrode. The MOS transistor 24 is isolated by a field shield element-isolation structure formed of a polysilicon film 13 which is a shield gate electrode having a constant potential applied thereto. The polysilicon film 13 is coated for insulation by silicon oxide films 12 and 14 and a sidewall oxide film 15.

A capacitor 39 comprises polysilicon films 36 and 41 which constitute a lower electrode (storage electrode), a polysilicon film 38 which is an upper electrode (cell plate electrode) and an ONO film (silicon oxide/silicon nitride/silicon oxide film) 37 formed between those two electrodes. The polysilicon film 36 which is a part of the lower electrode is connected to a polysilicon film 22b which is a lead electrode (pad electrode) through a contact hole (storage contact) 35 formed in a BPSG film 25. The polysilicon film 22b more largely extends over the field shield element-isolation structure and is connected to one of the pair of impurity diffusion layers 23 of the MOS transistor.

The other of the pair of impurity diffusion layers 23 is connected to the polysilicon film 22a which is the lead electrode and the polysilicon film 22a is connected to a polycide layer 31 which is a bit line through a contact hole (bit contact) 26.

A cap silicon oxide film 32 and a polysilicon film 41 are successively formed on the polycide layer 31 which is the bit line and the polysilicon film 41 is connected to the polysilicon film 36. The capacitor lower electrode 41 is formed of the polysilicon film 41 and the polysilicon film 36.

Since the DRAM memory cell of the present embodiment has the COB structure in which the capacitor is formed on the bit line, the capacitance of the capacitor may be increased while keeping the plane area of the memory cell unchanged, and the noise between bit lines is reduced by a shield effect of the bit line by the capacitor. Further, since the polysilicon film 41 which is a part of the capacitor lower electrode is formed on the bit line, the capacitance of the capacitor may be increased by an amount corresponding to the thickness of the polysilicon film 41.

The manufacturing process of the DRAM shown in FIG. 3 will be explained with reference to FIGS. 1A-1G and FIGS. 2A-2F.

Figure 1A:
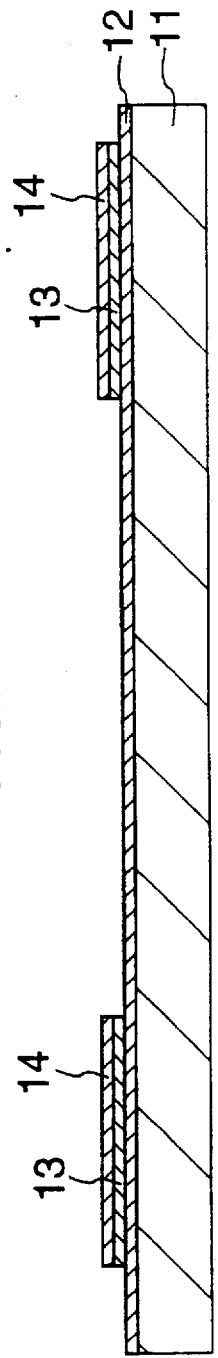

First, as shown in FIG. 1A, a pad silicon oxide film 12 having a thickness of 40 to 60 nm is formed on the P-type silicon substrate 11 by a thermal oxidization process.

Then, a polysilicon film 13 doped with phosphorus and having a thickness of 150 to 200 nm and a cap silicon oxide film 14 having a thickness of 250 to 300 nm are successively deposited by a low pressure CVD process. The silicon oxide film 14 and the polysilicon film 13 disposed at an area where an element active region is to be formed are successively removed by photolithography and anisotropic etching and the polysilicon film 13 and the silicon oxide film 14 are left only in the area where an element-isolation region is to be formed.

Figure 1B:
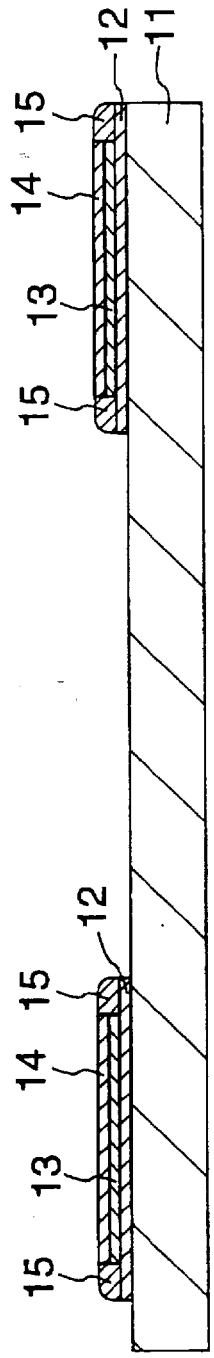

Then, as shown in FIG. 1B, a silicon oxide layer having a thickness of 250 to 300 nm is deposited by the low pressure CVD process and the anisotropic dry etching is applied to the entire surface of the silicon oxide film to form the sidewall oxide films 15 of the silicon oxide film on the side walls of polysilicon film 13 and the silicon oxide film 14.

As a result, the element-isolation region of the field shield structure comprising the polysilicon film 13, the silicon oxide films 12 and 14 and the sidewall oxide films 15 and the element active regions surrounded by the element isolation region are formed. The silicon film 12 in the element active region is removed by overetching applied to the silicon oxide film for forming the sidewall oxide films 15. Then, impurities are ion-implanted into the element active region to control a threshold voltage of the transistor formed therein by using the silicon oxide film 14 and the sidewall oxide films 15 as a mask.

Figure 1C:
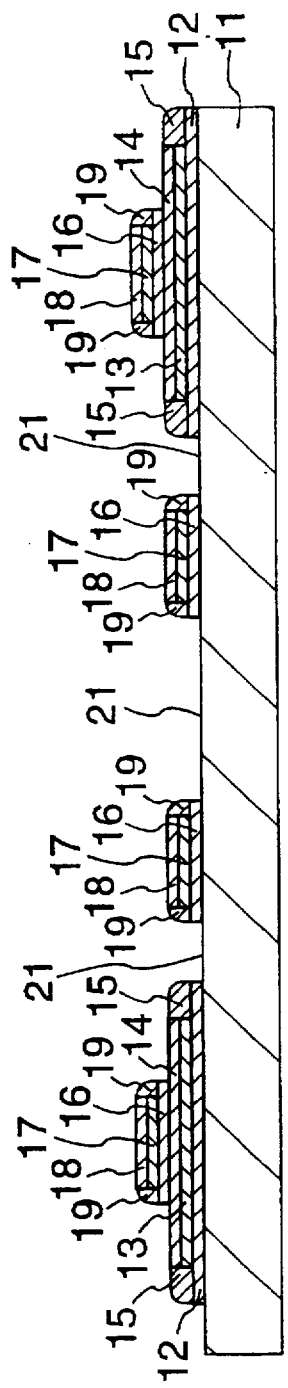

Then, as shown in FIG. 1C, a silicon oxide film 16 having a thickness of 10 to 15 nm is formed as the gate oxide film on the surface of the silicon substrate 11 including the element active region and the element-isolation region by the thermal oxidization process. Then, an N-type polysilicon film 17 having a thickness of 200 nm and a silicon oxide film 18 are successively deposited by the CVD process and the silicon oxide film 18 and the polysilicon film 17 are patterned to form word lines (gate electrodes) extending parallelly in a predetermined direction. The word lines of the polysilicon film 17 are formed over the element active regions and the field shield structure, and connected to a row decoder of the peripheral circuit.

Then, a silicon oxide film, having a thickness of approximately 150 nm, is deposited by the low pressure CVD process, and an anisotropic dry etching is applied to the entire surface of the silicon oxide film to form the sidewall oxide films 19 of the silicon oxide film on the side walls of the polysilicon film 17 and the silicon oxide film 18.

By the overetching applied to the silicon oxide film to form the sidewall oxide films 19, portions of the silicon oxide film 16, other than those below the polysilicon films 17 and the sidewall oxide films 19, are removed and a contact hole 21 is formed at the element active region in self-alignment with the polysilicon films 13 and 17.

Then, as shown in FIGS. 1D and 2A, a polysilicon film having a thickness of approximately 150 nm which contacts the element active regions through the contact holes 21 is deposited by the low pressure CVD process. Then, an anisotropic dry etching is applied to the polysilicon film to form a polysilicon film 22a having the lead electrode pattern and extending substantially only on the element active region at one side of the polysilicon film 17 to be later connected with the bit line and a polysilicon film 22b having the lead electrode pattern and extending over the element isolation region between bit lines which are later formed at the other side of the polysilicon film 17 to be later connected to the lower electrode of the capacitor.

Then, arsenic is ion-implanted into the polysilicon films 22a and 22b and as shown in FIGS. 1E and 2B, a BPSG (boro-phospho silicide glass) film 25 having a thickness of approximately 300 nm is deposited by the low pressure CVD process as the interlayer insulating film and it is thermally processed at a temperature of 850° to 900° C. As a result, the BPSG film 25 reflows to have a flat surface and the arsenic contained in the polysilicon films 22a and 22b diffuses in solid phase diffusion into the element active regions which the polysilicon films 22a and 22b contact, so that a pair of N-type impurity diffusion layers 23 are formed as the source and drain regions of the transistor.

So far, the transistor 24 which forms the DRAM memory cell having the polysilicon film 17 as the gate electrode is manufactured. Then, a contact hole 26 leading to the polysilicon film 22a which is the lead electrode to be connected with the bit line has been formed at a predetermined position in BPSG film 25 by the photolithography and etching.

Then, an N-type polysilicon film 27 having a thickness of 50 nm is deposited on the surface of the product by the CVD method to fill the contact hole 26, and a tungsten silicide having a thickness of approximately 200 nm is deposited by the sputtering process, or the CVD process, to form a polycide layer 31 including the polysilicon film 27 and the tungsten silicide 28. Then, a cap silicon oxide film 32 and a polysilicon film 41, each having a thickness of approximately 100 nm, are successively deposited by the CVD process, and the polysilicon film 41, the silicon oxide film 32, and the polycide layer 31 are patterned to form a plurality of bit lines extending parallelly in a direction perpendicular to the word lines.

As seen from FIG. 3, the contact holes 26 for the bit lines are arranged such that four word lines (polysilicon films 17) exist between an adjacent two of the contact holes disposed in a direction in which the bit line (polycide layer 31) extends, three bit lines exist between an adjacent two of the contact holes disposed in a direction in which the word line extends, and each contact hole is common to two adjacent memory cells disposed along the direction in which the bit line extends. Further, the bit line of polycide layer 31 is connected to a sense amplifier or an I/O gate in the peripheral circuit.

As shown in FIG. 2C, a silicon oxide film, having a thickness of approximately 200 nm, is deposited by the low pressure CVD process and an anisotropic dry etching is applied to the entire surface of the silicon oxide film to form sidewall oxide films 33 of silicon oxide films on the side walls of a lamination of the polycide layer 31, the silicon oxide film 32, and the polysilicon film 41.

Then, as shown in FIG. 2D, a photoresist 34 is formed in a pattern to cover an area other than the area in which the contact hole for the lower electrode of the capacitor is to be formed. Then, an anisotropic etching is applied to the BPSG film 25 by using $CCl_2F_2/SF_6$ gas as the etching gas, and a contact hole 35 leading to the polysilicon film 22b into the polycide layer 31 is formed as self-aligned with the photoresist 34, the sidewall oxide films 33, and the polysilicon film 41 used as a mask.

Figure 1F:
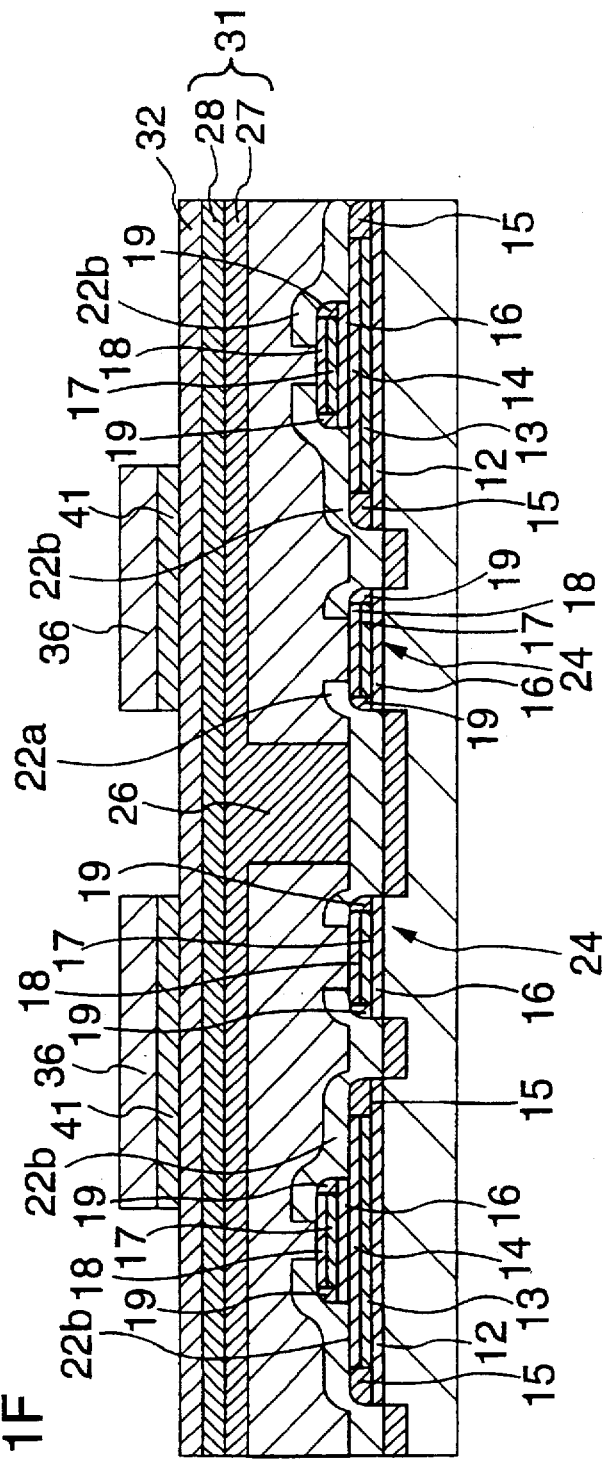

Then, as shown in FIGS. 1F and 2E, the photoresist 34 is removed and an N-type polysilicon film 36 is deposited by the low pressure CVD process on the entire surface of the product. Then, the polysilicon film 36 is patterned into a form of the lower electrode of the capacitor in each memory cell by using a photoresist (not shown). In this case, the silicon oxide film 32 serves as the etching stopper of the polysilicon film 41.

Figure 1G:
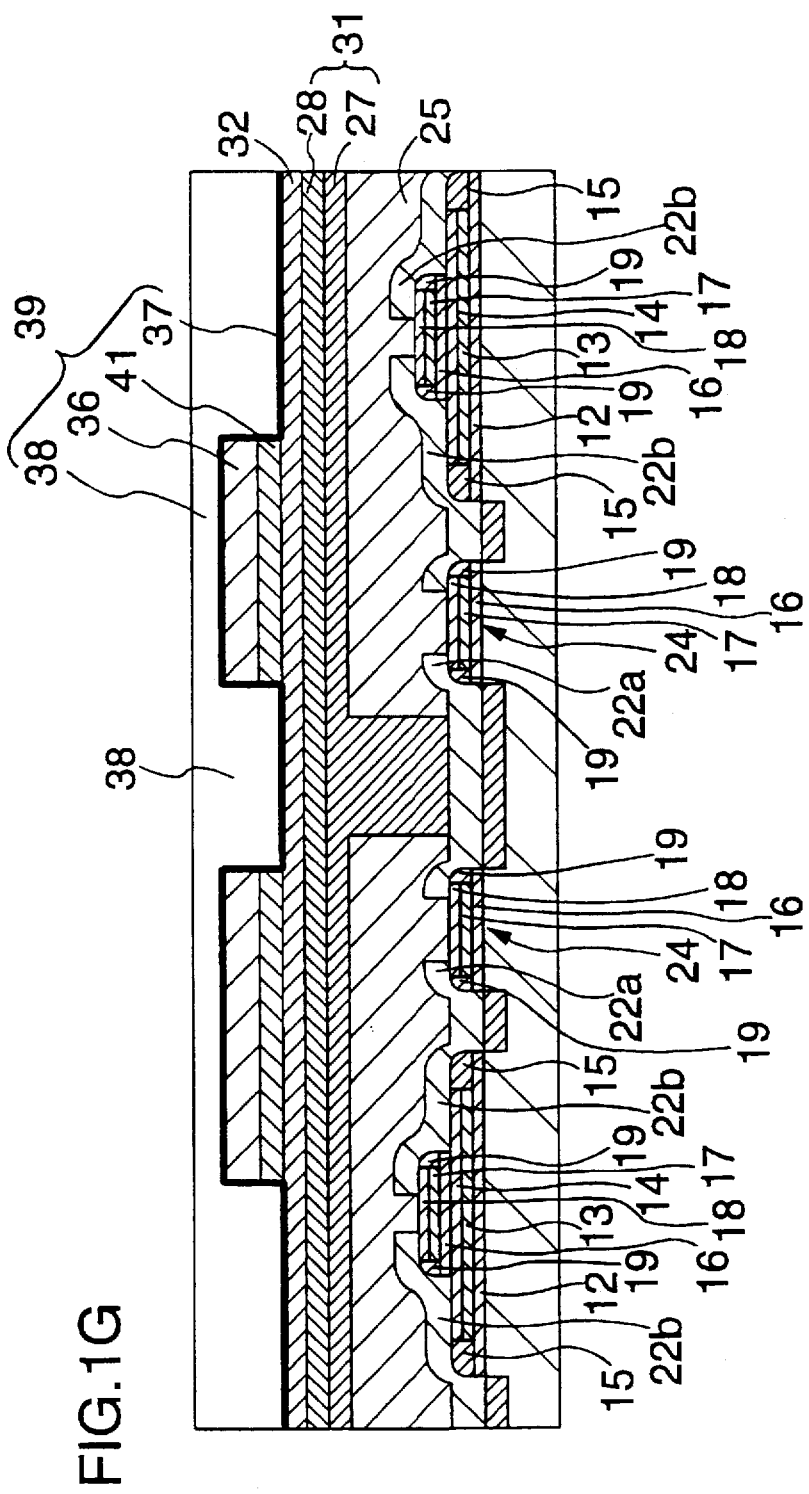

Then, as shown in FIGS. 1G and 2F, an ONO film 37 having a thickness equivalent to a silicon oxide film thickness of 5 to 6 nm is formed on the entire surface of the product, and an N-type polysilicon film 38 is deposited on the entire surface of the product as the upper electrode of the capacitor. So far, the capacitor 39 of the DRAM memory cell has been completed. Then, the strap wirings of the word lines are formed by Al films (not shown), and the surface protection film (not shown) is formed to complete the DRAM.

Figure 4A:
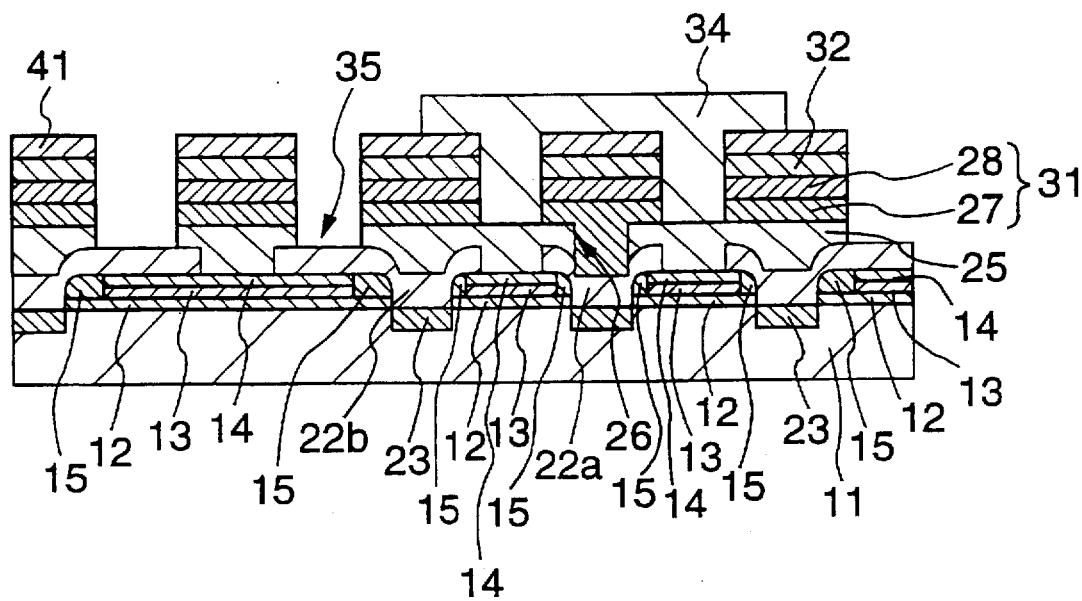
FIGS. 4A and 4B show sectional structures taken along a line II-II' of FIG. 3 in the steps, which are different from those of the first embodiment, in a manufacturing method of the semiconductor memory device according to a second embodiment of the present invention.
Figure 4B:
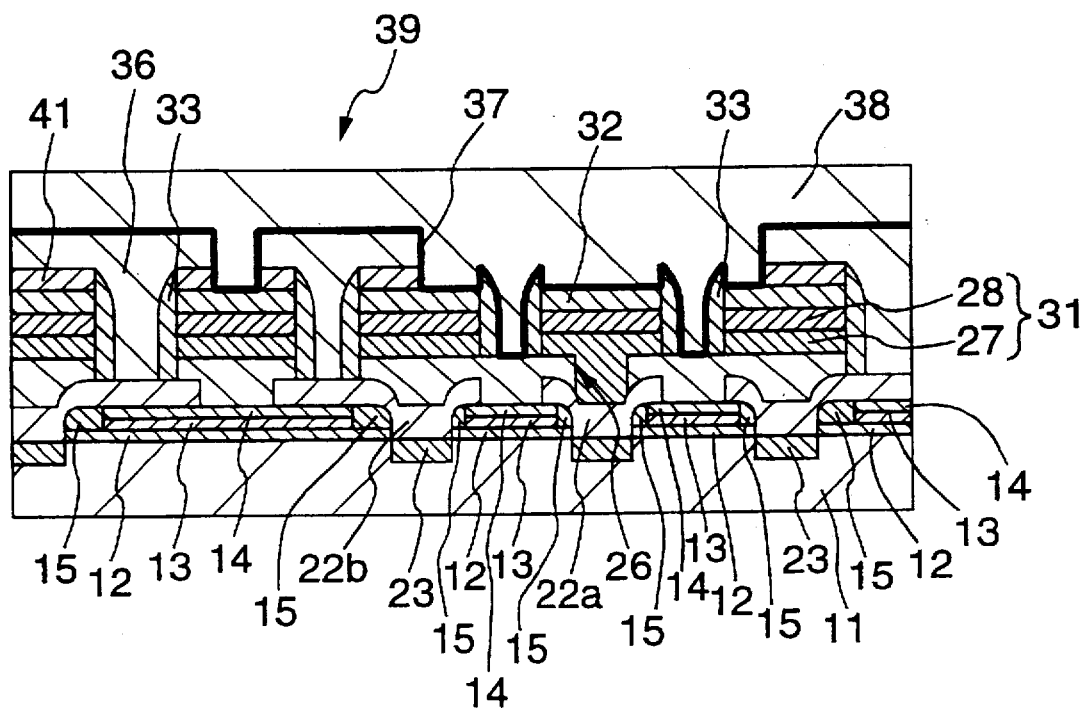

Referring to FIGS. 4A and 4B, a second embodiment of the manufacturing method of the present invention is now explained.

FIG. 4A shows an intermediate process of the manufacturing method of the second embodiment. In this embodiment, substantially the same processes as those of the first embodiment are conducted up to the patterning of the polysilicon film 41, the silicon oxide film 32, and the polycide layer 31 to the bit lines. In this embodiment, however, the photoresist 34 to cover the area other than the area in which the contact hole for the lower electrode of the capacitor is to be formed, is formed after the patterning.

Then, an anisotropic etching is applied to the BPSG film 25 by using the $CCl_2F_2/SF_6$ as the etching gas and by using the photoresist 34, and the polysilicon film 41 as a mask, to form the contact hole 35 leading to the polysilicon film 22b into the polycide layer 31 as self-alignment therewith.

Next, as shown in FIG. 4B, an N-type polysilicon film 36 is deposited by the low pressure CVD method on the entire surface of the product after forming sidewall oxide films 33. Thereafter, the polysilicon films 36 and 41 are patterned by etching using a photoresist (not shown) as a mask into a form of the lower electrode of the capacitor of each memory cell. In this process, the silicon oxide film 32 serves as an etching stopper of the polysilicon film 41.

Then, an ONO film 37 having a thickness equivalent to a silicon oxide film thickness of 5 to 6 nm is formed on an entire surface of the product, and an N-type polysilicon film 38 is formed thereon to be used for the upper electrode of the capacitor of each memory cell. In this manner, the capacitor 39 of each DRAM memory cell is completed. Thereafter, strap wirings of the word lines are formed by Al films (not shown) and then a surface protection film is formed, thereby completing the DRAM.

In any one of the first and second embodiments, when the contact hole 35 is formed in the BPSG film 25, the polysilicon 41 serves as a part of the etching mask and provides the etching selection ratio of approximately 50 or higher with respect to the BPSG film 25.

Thus, in the manufacturing method of the present invention, the thickness of the polysilicon film 41 may be significantly reduced as compared with the prior art thereby permitting reduction of the total thickness of the silicon oxide film 32 and the polysilicon film 41 on the polycide layer 31. As a result, the height of the memory cell is reduced as compared to the prior art, and the step between the memory cell array area and the peripheral circuit area may be reduced. Accordingly, the wiring extending over the memory array area and the peripheral circuit area is prevented from being broken due to the poor resolution in lithography, and a highly reliable DRAM is provided.

Further, since a part of the lower electrode of the capacitor is formed of the polysilicon film 41 on the bit line, the DRAM may be manufactured with the increased capacitor capacitance.

Further, since the bit lines are formed by a low resistance polycide layer 31, the operational speed of the DRAM is fast and the stability is high. The silicide layer of the polycide layer 31 may be a silicide layer of a high melting point metal instead of the tungsten silicide layer 28. Further, since the capacitance insulating film of the capacitor is formed of the ONO film 37 which is a laminate of the silicon oxide film and the silicon nitride film, the capacitance of the capacitor is relatively large and the leakage current is small.

Further, since the impurity diffusion layers 23 which are source and drain are formed by diffusing impurities from the polysilicon films 22a and 22b, the impurity diffusion layers 23 of a shallow diffusion depth may be formed and the miniaturization of the memory cells is enhanced. The impurity diffusion layers 23 may be formed by ion-implantation conducted in the step of FIG. 1C. Since the polysilicon films 22a and 22b are used as the pad lead electrodes, the positions of the contact holes 26 and 35 may be determined with a relatively high degree of freedom and the freedom of design of the memory cell is enhanced.

In accordance with the present invention, when the contact hole for the lower electrode of the capacitor of each memory cell is formed in the interlayer insulating film, the third polysilicon film formed on the bit line is used as a part of the mask. Thus, since a large etching selection ratio may be secured between the interlayer insulating film and the polysilicon film, the third polysilicon film may be made thinner thus reducing the total thickness of the cap insulating film and the polysilicon film on the bit line.

Accordingly, the height of the lower electrode of the capacitor may be reduced and the step between the memory cell area and the peripheral circuit area is reduced. Thus, in the photolithography when forming the wiring extending over the memory array area and the peripheral circuit area such as the strap wiring of the word lines, the poor resolution due to insufficient depth of focus in light-exposure is reduced and the highly reliable semiconductor memory device can be manufactured with a high yield.

In addition, since the third polysilicon film formed on the bit line with the cap insulating film interposed therebetween is used as a part of the lower electrode of the capacitor in addition to the fourth polysilicon film, and the capacitance of the memory cell is increased as compared with the memory cell having the lower electrode formed only by the fourth polysilicon film.

What is claimed is:

1. A semiconductor memory device comprising:

an element isolation structure for defining a plurality of element active regions isolated by said element isolation structure;

a plurality of memory cells formed on a surface of a semiconductor substrate, each memory cell including a transistor having a pair of impurity diffusion layers and a gate electrode, and a capacitor, said transistor being formed in one of said element active regions;

a first insulating film formed to cover the transistors of the memory cells;

a plurality of word lines formed on the surface of said semiconductor substrate and extending parallel to each other, each word line being connected to the gate electrode of the transistor of at least one of the memory cells;

a plurality of bit lines each connected to one of the pair of impurity diffusion layers of the transistor of at least a selected one of the memory cells through a first contact hole formed in said first insulating film, a conductive film being formed on a top surface of each of said bit lines with a second insulating film interposed therebetween:

a lower electrode of the capacitor of each of said memory cells formed at a predetermined position on said first insulating film, said lower electrode being electrically connected to said conductive film formed on one of said bit lines and also to the other of the pair of impurity diffusion layers of the transistor of the associated memory cell through a second contact hole formed in said first insulating film;

a first pad film of a conductive material provided for electrically connecting each of said bit lines to one of the pair of impurity diffusion layers of the associated transistor; and a second pad film of a conductive material provided for electrically connecting said lower electrode of the capacitor to the other of the impurity diffusion layers of the associated transistor;

wherein said conductive film formed on the top surface of each of said bit lines is formed by a material having a lower etching rate than that of said first insulating film in etching for said second contact hole in said first insulating film and wherein said second pad film extends over said element isolation structure up to a portion corresponding to a space between adjacent two of said bit lines.

2. A semiconductor memory device according to claim 1 wherein the etching rate of said conductive material formed on each of said bit lines is lower than 1/50 of the etching rate of said first insulating film.

3. A semiconductor memory device according to claim 1 wherein each of said bit lines includes a polycide layer having a two-layer structure of a polysilicon film and a tungsten silicide film.

4. A semiconductor memory device according to claim 1, wherein said element isolation structure has a field shield electrode formed on the surface of said semiconductor substrate.

5. A semiconductor memory device according to claim 1, wherein said first pad film has portions extending over two adjacent word lines, respectively.

6. A semiconductor memory device according to claim 1, wherein sidewall insulating films are formed on side walls of a lamination of each of said bit lines, the second insulating film and at least a part of the conductive film formed thereon.

7. A semiconductor memory device according to claim 1, wherein each of said bit lines includes a polycide layer.

8. A semiconductor memory device according to claim 1, wherein said first insulating film includes a BPSG film.

9. A semiconductor memory device according to claim 1, wherein said conductive film includes a silicon.

10. A semiconductor memory device according to claim 1, wherein said second insulating film disposed between each of said bit lines and the conductive film formed on the bit line includes an oxide film.

11. A semiconductor memory device including a transistor formed on a semiconductor substrate and having a pair of impurity diffusion layers and a gate electrode and a capacitor having a lower electrode connected to one of the impurity diffusion layers, said semiconductor memory device comprising:

an element isolation structure for defining a plurality of element active regions isolated from each other by said element isolation structure;

a first insulating film formed on said semiconductor substrate to cover said transistor, which is formed in one of said element active regions;

a first contact hole formed in said first insulating film at its portion disposed on the other of said impurity diffusion layers;

a first conductive film electrically connected to the other of said impurity diffusion layers through said first contact hole, said first conductive film being formed to cover at least an inner side of said first contact hole and to extend over said first insulating film;

a second insulating film formed on said first conductive film;

a second conductive film formed on said second insulating film, said second conductive film, said second insulating film and said first conductive film being formed in a pattern disposed on said first insulating film;

a second contact hole formed in said first insulating film;

said second conductive film being formed of a material having an etching rate smaller than that of said first insulating film in etching said first insulating film for forming said second contact hole;

a third conductive film electrically connected through said second contact hole to the one of said impurity diffusion layers, said third conductive film constituting the lower electrode of the capacitor together with said second conductive film; and a pad film of a conductive material disposed between said third conductive film and the one of said impurity diffusion layers so that said third conductive film is connected through said pad film to the one of said impurity diffusion layers, said pad film extending over said element isolation structure up to a portion corresponding to a space between adjacent two of said bit lines.

12. A semiconductor memory device according to claim 11, wherein said second conductive film is made of a material having an etching rate smaller than 1/50 of the etching rate of said first insulating film.

13. A semiconductor memory device according to claim 11, wherein said first insulating film includes a BPSG film.

14. A semiconductor memory device according to claim 11, wherein said first conductive film includes a polycide film.

15. A semiconductor memory device according to claim 11, wherein said second conductive film is made of a material including a silicon.

16. A semiconductor memory device according to claim 11, further comprising sidewall insulating films formed on side walls of said first conductive film.

17. A semiconductor memory device according to claim 11, wherein said element isolation structure includes a field shield electrode for element isolation.

18. A semiconductor memory device according to claim 11, further comprising a dielectric film formed on the lower electrode of the capacitor and an upper electrode of the capacitor formed on said dielectric film.

19. A semiconductor device comprising:

a first insulating film formed on a semiconductor substrate;

a first conductive film formed on said first insulating film;

sidewall insulating films formed on side walls of said first conductive film;

a second insulating film formed on said first conductive film;

a second conductive film formed on said second insulating film, said second conductive film being formed in at least two patterns together with said second insulating film and said first conductive film;

a contact hole formed in said first insulating film at a portion thereof disposed between said two patterns of said first conductive film, said second insulating film and said second conductive film; and a third conductive film formed on said second conductive film and covering an inside of said contact hole, wherein said second conductive film is made of a material having an etching rate smaller than that of said first insulating film when etching said first insulating film for formation of said contact hole.

20. A semiconductor device according to claim 19, further comprising a lower electrode of a capacitor formed of said second and third conductive films.

21. A semiconductor memory device comprising:

a plurality of memory cells formed on a surface of a semiconductor substrate, each memory cell including a transistor having a pair of impurity diffusion layers and a gate electrode, and a capacitor;

a first insulating film formed to cover the transistors of the memory cells;

a plurality of word lines formed on the surface of said semiconductor substrate and extending parallel to each other, each word line being connected to the gate electrode of the transistor of at least one of the memory cells;

a plurality of bit lines each connected to one of the pair of impurity diffusion layers of the transistor of at least a selected one of the memory cells through a first contact hole formed in said first insulating film, a conductive film being formed on a top surface of each of said bit lines with a second insulating film interposed therebetween, wherein each of said bit lines, said conductive film formed on said bit line and said second insulating film interposed between said bit line and said conductive film are defined between side walls extending along the bit line;

a sidewall made of an insulating material and formed on each of said side walls to cover at least said bit line exposed to said side wall;

a lower electrode of the capacitor of each of said memory cells formed at a predetermined position on said first insulating film, said lower electrode being electrically connected to said conductive film formed on one of said bit lines and also to the other of the pair of impurity diffusion layers of the transistor of the associated memory cell through a second contact hole formed in said first insulating film;

wherein said conductive film formed on the top surface of each of said bit lines is formed by a material having a lower etching rate than that of said first insulating film in etching for said second contact hole in said first insulating film.

22. A semiconductor memory device according to claim 21, wherein the etching rate of said conductive material formed on each of said bit lines is lower than 1/50 of the etching rate of said first insulating material.

23. A semiconductor memory device according to claim 21, wherein each of said bit lines includes a polycide layer having a two-layer structure of a polysilicon film and a tungsten silicide film.

24. A semiconductor memory device according to claim 21, wherein the transistor of each of said memory cells is formed in one of a plurality of element active regions isolated from each other by an element isolation structure having a field shield electrode formed on the surface of the semiconductor substrate.

25. A semiconductor memory device according to claim 1, wherein said first pad has a portion extending over two adjacent word lines and said second pad film has a portion extending over the field shield electrode of said element isolation structure.

26. A semiconductor memory device according to claim 21, wherein sidewall insulating films are formed on side walls of a lamination of each of said bit lines, the second insulating film and at least a part of the conductive film formed thereon.

27. A semiconductor memory device according to claim 21, wherein each of said bit lines includes a polycide layer.

28. A semiconductor memory device according to claim 21, wherein said first insulating film includes a BPSG film.

29. A semiconductor memory device according to claim 21, wherein said conductive film includes a silicon.

30. A semiconductor memory device according to claim 21, wherein said second insulating film disposed between each of said bit lines and the conductive film formed on the bit line includes an oxide film.

31. A semiconductor memory device including a transistor formed on a semiconductor substrate and having a pair of impurity diffusion layers and a gate electrode and a capacitor having a lower electrode connected to one of the impurity diffusion layers, said semiconductor memory device comprising:

a first insulating film formed on said semiconductor substrate to cover said transistor;

a first contact hole formed in said first insulating film at its portion disposed on the other of said impurity diffusion layers;

a first conductive film electrically connected to the other of said impurity diffusion layers through said first contact hole, said first conductive film being formed to cover at least an inner side of said first contact hole and to extend over said first insulating film;

a second insulating film formed on said first conductive film;

a second conductive film formed on said second insulating film, said second conductive film, said second insulating film and said first conductive film being formed in a pattern disposed on said first insulating film and defined between side walls extending in a predetermined direction;

a sidewall insulating film made of an insulating material and formed on each of said side walls to cover at least said first conductive film exposed to said side wall;

a second contact hole formed in said first insulating film;

said second conductive film being formed of a material having an etching rate smaller than that of said first insulating film in etching said first insulating film for forming said second contact hole; and a third conductive film electrically connected through said second contact hole to the one of said impurity diffusion layers, said third conductive film constituting the lower electrode of the capacitor together with said second conductive film.

32. A semiconductor memory device according to claim 31, wherein the etching rate of said conductive material formed on each of said bit lines is lower than 1/50 of the etching rate of said first insulating material.

33. A semiconductor memory device according to claim 31, wherein said first insulating film includes a BPSG film.

34. A semiconductor memory device according to claim 31, wherein said first conductive film includes a polycide film.

35. A semiconductor memory device according to claim 31, wherein said second conductive film is made of a material including a silicon.

36. A semiconductor memory device according to claim 31, further comprising a dielectric film formed on the lower electrode of the capacitor and an upper electrode of the capacitor formed on said dielectric film.

* * * * *